United States Patent [19]

Hart

[11] 4,380,742
[45] Apr. 19, 1983

[54] FREQUENCY/PHASE LOCKED LOOP CIRCUIT USING DIGITALLY CONTROLLED OSCILLATOR

[75] Inventor: Patrick J. Hart, Johnson City, Tenn.

[73] Assignee: Texas Instruments Incorporated, Dallas, Tex.

[21] Appl. No.: 175,170

[22] Filed: Aug. 4, 1980

[51] Int. Cl.³ .............................................. H03L 7/14
[52] U.S. Cl. ..................................... 331/1 A; 331/17; 331/25; 331/27; 331/34
[58] Field of Search ...................... 331/1 A, 14, 17, 18, 331/25, 27, 34

[56] References Cited

U.S. PATENT DOCUMENTS

| | | | |
|---|---|---|---|
| 3,271,688 | 9/1966 | Gschwind et al. | 331/1 A X |
| 3,484,712 | 12/1969 | Foote et al. | 331/18 |
| 3,824,483 | 7/1974 | Margala et al. | 331/1 A |
| 3,840,821 | 10/1974 | Conway | 331/14 |
| 3,989,931 | 11/1976 | Phillips | 331/1 A X |
| 4,144,489 | 3/1979 | Ward et al. | 331/1 A X |
| 4,166,249 | 8/1979 | Lynch | 331/1 A X |
| 4,309,662 | 1/1982 | Baudoux | 331/1 A X |

Primary Examiner—Siegfried H. Grimm
Attorney, Agent, or Firm—James P. McAndrews; John A. Haug; Melvin Sharp

[57] ABSTRACT

A circuit for synchronizing the frequency and/or phase of an output frequency signal ($f_0$) to a reference frequency signal ($f_{ref}$) is disclosed. A digitally controlled oscillator produces an output frequency signal which varies dependent upon an input digital signal which also is varied. A comparator means is coupled to the oscillator and the reference signal for determining the presence or absence of a frequency or phase difference between the output frequency signal and the reference frequency signal and generates a digital signal to the oscillator indicating whether the output frequency signal should be increased or decreased. In one embodiment, the comparator means comprises an up/down counter and the digitally controlled oscillator comprises a digital-to-analog converter (DAC) coupled to an oscillator circuit. The output of the oscillator circuit ($f_0$) is fed back through a divide by N counter circuit. The most significant digit (MSB) of the counter is connected to the up/down terminal of the up/down counter. The reference frequency signal is connected to the clock terminal of the up/down counter and through gating circuitry to the clear terminal of the divide by N counter. The up/down counter determines whether the reference frequency signal or the output frequency signal occurs first and generates a digital signal to the DAC and oscillator which adjusts the oscillator either upward or downward until the divided down oscillator signal is in synchronization with the reference signal.

9 Claims, 8 Drawing Figures

FREQUENCY/PHASE LOCKED LOOP CIRCUIT USING DIGITALLY CONTROLLED OSCILLATOR

This invention relates to frequency and/or phase lock loop circuits and more particularly to such a circuit employing digital feedback.

Typical phase or frequency-lock loops utilize low-pass filters to integrate the phase difference between a reference signal and an output signal. Typically this low pass filter is an RC network requiring a rather large capacitor; large capacitors are disadvantageous as they do not lend themselves to integration on a single semiconductor chip. Another disadvantage of typical phase or frequency-lock loops is that if the reference signal is lost, synchronization of the output frequency is lost. Still another disadvantage of prior art frequency and/or phase locked loops is their potential instability and susceptibility to noise immunity.

Accordingly it is an object of the present invention to provide a frequency or phase locked loop circuit which does not lose synchronization if the reference frequency signal is lost.

Another object of the present invention is to provide a frequency and/or phase locked loop circuit which does not require external additional parts to set the frequency of the oscillator.

Another object of the present invention is to produce a frequency or phase locked loop circuit which lends itself to integration on a semiconductor chip.

Another object of the present invention is to produce a circuit which is easy to manufacture and at a reduced cost.

Another object of the present invention is to utilize digital techniques throughout the frequency and/or phase locked loop thereby giving additional stability and noise immunity in the circuit.

Other objects and features of the invention will become more readily understood from the following detailed description and appended claims when read in conjunction with the accompanying drawings, in which like reference numerals designate like parts throughout the figures thereof, and in which:

Figure 1:
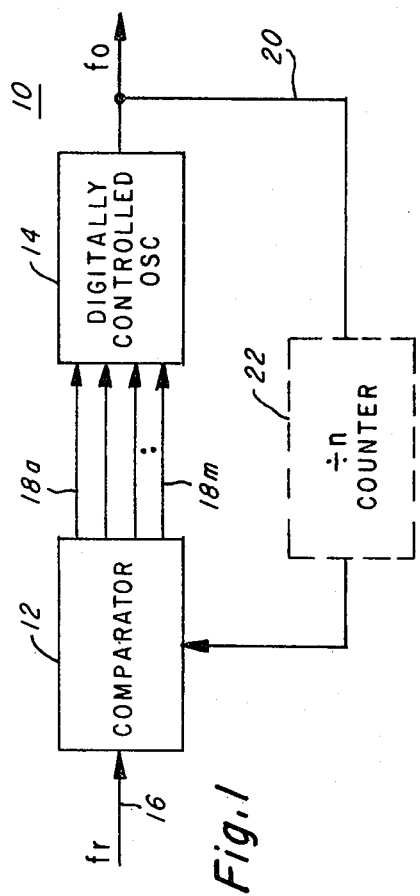
FIG. 1 is a simplified block diagram of the frequency and/or phased locked loop of the present invention.

Referring now to FIG. 1 a frequency and/or phase locked loop circuit 10 is illustrated. The circuit 10 is comprised of a comparator 12 and digitally controlled oscillator 14. A reference signal, $f_r$, is applied to comparator 12 by way of line 16. The output of comparator 12 is coupled to digitally controlled oscillator 14 by a plurality of lines 18a–18m. Lines 18a–18m transmit a series of digital signals from comparator 12 to oscillator 14. The output of oscillator 14 is fed back by way of line 20 to comparator 12. In some applications, a divide by N counter 22 is inserted in line 20 such that $f_o = N f_r$.

In operation, digitally controlled oscillator 14 produces an output frequency $f_o$ which can be varied dependent upon the digital input signals present on lines 18a–18m; in other words, digitally controlled oscillator 14 is a variable digital-to-frequency converter. Assuming, for purposes of discussion and explanation that divide by N counter 22 is not incorporated within line 20, then output frequency $f_o$ is fed directly back to comparator 12. Comparator 12 determines whether signal $f_r$ or $f_o$ occurs first and then generates a digital signal on lines 18a–18m indicating whether the output frequency signal $f_o$ should be increased or decreased. A plurality of comparisons are made in comparator 12 between the first to occur of signals $f_r$ and $f_o$; after each comparison, the digital signals on lines 18a–18n are incremented in discrete digital steps to vary the output $f_o$ on line 20 of digitally controlled oscillator 14 until $f_o$ is synchronized or locked with $f_r$. With counter 22 omitted from the circuit 10, when $f_o$ is synchronized with $f_r$, then $f_o$ is substantially equal to $f_r$. If the divide by N counter 22 is included in line 20, then $f_o = N \times f_r$.

Figure 2:
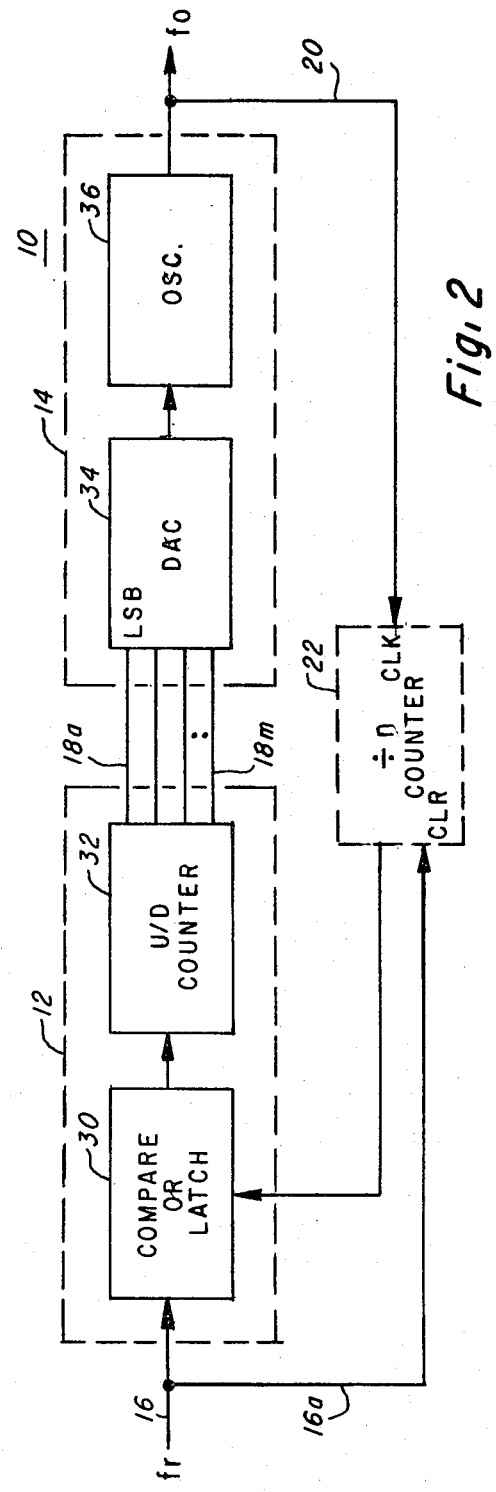
FIG. 2 is another block diagram of one embodiment of the circuit according to the present invention.

FIG. 2 illustrates a more detailed block diagram of the circuit according to the present invention. Comparator circuit 12 is comprised of a compare circuit 30 which is connected to up/down counter 32. The digital output from up/down counter 32 is coupled via lines 18a–18m to digitally controlled oscillator 14. Digitally controlled oscillator 14 is comprised of a digital-to-analog converter (DAC) 34 which in turn is coupled to variable frequency oscillator 36. The output of oscillator 36 is output frequency signal $f_o$ which is transmitted via line 20 back to divide by N counter 22. Line 20 is connected to the clock terminal of counter 22. The output of counter 22 is then fed back to compare circuit 30. Reference signal $f_r$ is coupled via line 16a to the clear terminal of counter 22.

Figure 3:
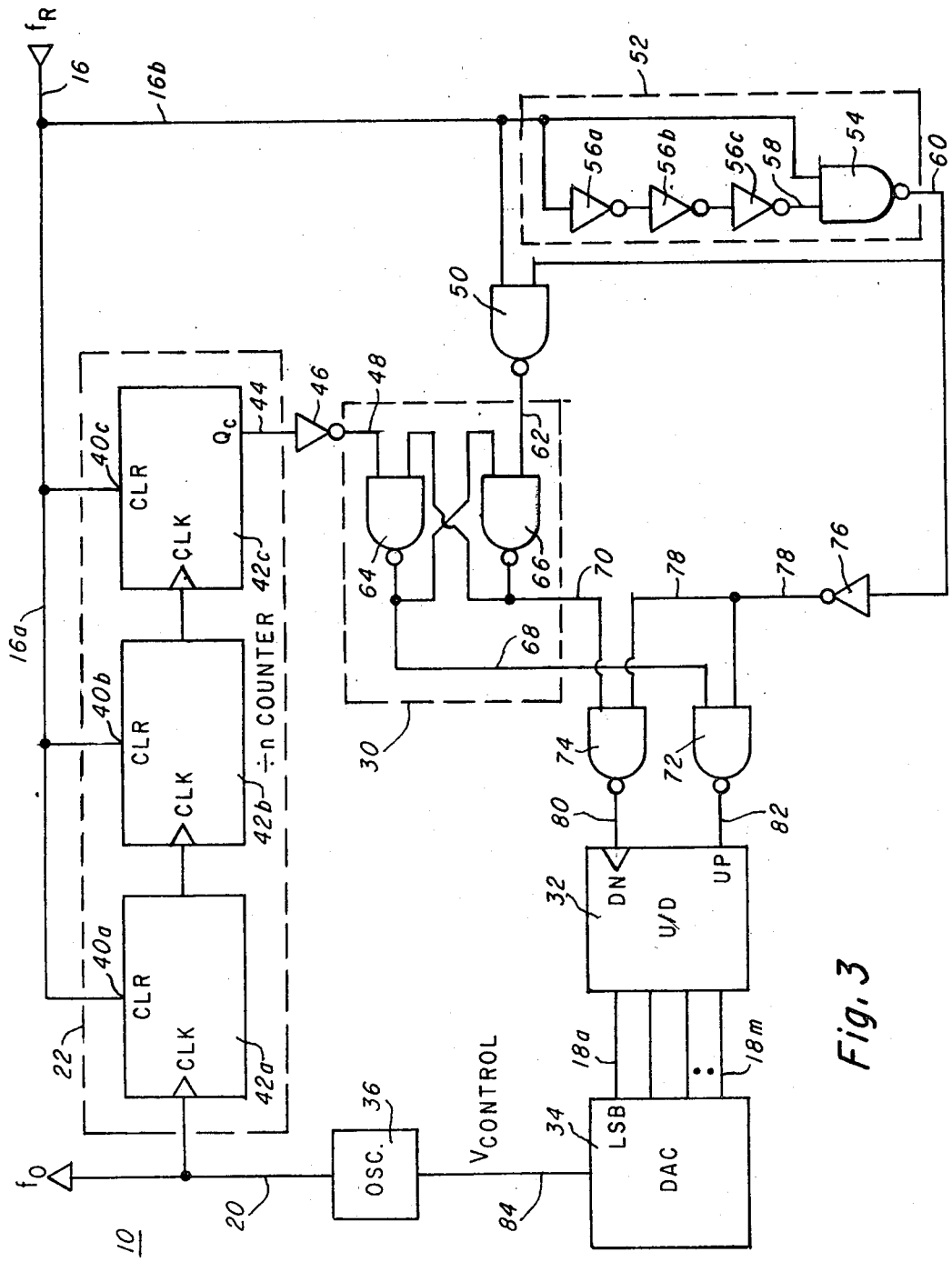
FIG. 3 is a schematic of the block diagram of FIG. 2.

FIG. 3 illustrates the schematic diagram of the block diagram of FIG. 2. Like numerals are utilized to designate like parts where possible. The reference frequency signal $f_r$ is input on line 16 and transmitted via line 16a to the clear terminals of stages 42a–42c respectively of divide by N counter 22. Stages 42a–42c are standard TTL counters designated as SN74193 manufactured and sold by Texas Instruments Incorporated, Dallas, Tex. The output of the third counter stage designated as $Q_c$ of counter 22 is transmitted via line 44 through gate 46 and line 48 which is connected to the set side of latch or compare circuit 30. Reference frequency signal $f_r$ is transmitted via line 16b to one side of gate 50. Line 16b also is connected to one shot circuit 52. More particularly, line 16b forms one input of gate 54 and line 16b is connected to a series of gates 56a–56c, the output 58 of which forms the second input to gate 54. The output of gate 54 (and one-shot 52) is fed via line 60 to gate 50. The output of gate 50 is tied to line 62 which is connected to the reset side of latch or compare circuit 30. Latch or compare circuit 30 is comprised of two gates 64 and 66 whose outputs are tied back to the other gate's input. The output of gates 64 and 66 are coupled by way of lines 68 and 70 to gates 72 and 74, respectively. The output of one-shot 52 on line 60 is coupled through inverter 76 to gates 72 and 74 through line 78. The output 80 from gate 74 is connected to the down terminal of up/down counter 32 while the output of gate 72 is connected by line 82 to the up terminal of up/down counter 32. The output from up/down counter 32 is a series of digital signals transmitted on lines 18a–18m to digital-to-analog converter (DAC) 34. The analog control voltage output from digital-to-analog converter 34 is transmitted via line 84 to oscillator 36. Oscillator 36 is a TTL precision timer connected as an astable oscillator and is a model No. SN72555 circuit manufactured and sold by Texas Instruments Incorporated, Dallas, Tex.

Figure 4:
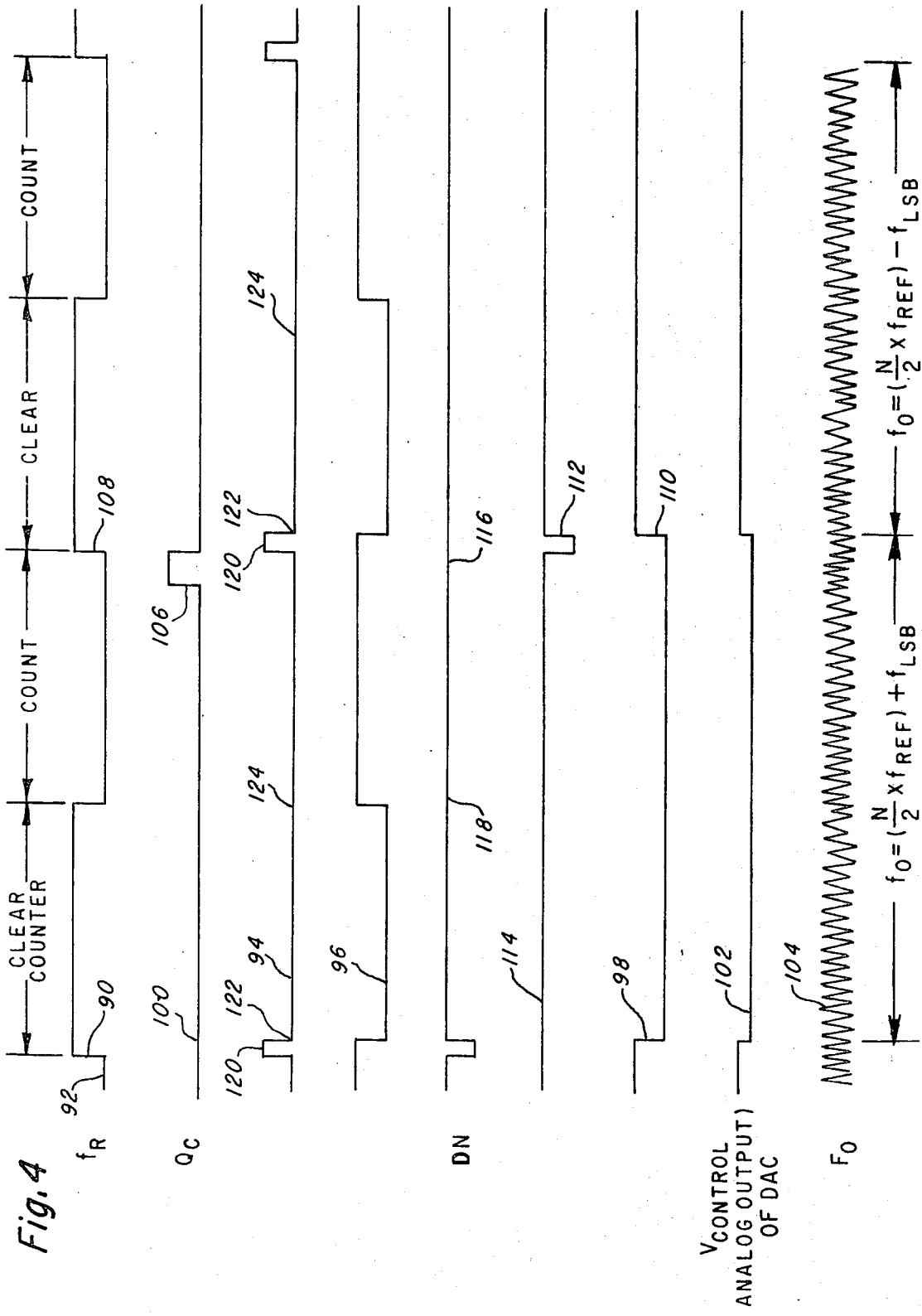
FIG. 4 are timing diagrams of waveforms at different points in the circuit of FIG. 3.

Referring now to FIG. 3 and the timing diagram of FIG. 4, the rising edge 90 of reference frequency signal $f_r$ waveform 92 clears the divide by N counter 22 during one half of the cycle of $f_r$. At the same time, the rising edge 90 of $f_r$ is applied to one-shot 52 which after going through inverter 76 generates a pulse 94 (FIG. 4) on line 78. The output pulse from the one-shot circuit 52 (the inverse of waveform 94) is applied to gate 50 and generates a reset signal 96 as shown in FIG. 4; this resets comparator latch 30 causing a 1 to be applied to gate 74 on line 70. The 1 on line 70 insures that a 0 is on the complement line 68 since it comes from the opposite or complemented side 64 of comparator latch 30. Therefore, with a 1 on line 70 and 0 on line 68, the waveform 94 (FIG. 4) which is applied to gates 72 and 74 on line 78 for a short period of time allows the 1 and the 0 to pass through gates 74 and 72 to the up/down counter 32. Accordingly, a pulse of the same duration as waveform 94, but opposite in polarity, is applied to the "down" input of up/down counter 32 because of the logic 1 on line 70. The logic 0 on line 68 prevents the waveform 94 from propagating through gate 72, thereby maintaining the "up" input to up/down counter 32 at a logic 1. The 0 on the down terminal of the up/down counter 32 causes counter 32 to count down one digital increment which means that waveform 98 (FIG. 4), the least significant bit (LSB), appearing on line 18a will decrease by one or go to a 0 as shown on the timing diagram. This assumes that the reference frequency $f_r$ rising edge 90 on the timing diagram in FIG. 4 occurs before the rising edge of output $Q_c$ (waveform 100) from the divide by N counter 32. In other words, if the selected bit $Q_c$ does not appear on line 44 from divide by N counter 22 before the reference frequency signal $f_r$ on line 16b (waveform 90), then the frequency of the reference signal $f_r$ is higher than the divided down output frequency $f_o$. Therefore up/down counter 32 will decrease the digital signal on lines 18a-18m by one count which will reduce the analog output (waveform 102 in FIG. 4) 84 from DAC 34. A reduction in the analog voltage output to oscillator 36 will increase incrementally the output frequency signal $f_o$ appearing on line 20 (waveform 104 in FIG. 4). As long as the reference signal is higher than the output frequency signal $f_o$, the up/down counter 32 will continue to count down by one least significant bit (LSB) which has the effect of increasing the output frequency $f_o$.

As previously mentioned, the circuit of FIG. 3 will continue to have its output frequency signal $f_o$ increase until the point in time when the divided down counter frequency appearing on line 44 from divide by N counter 22 occurs before the referenced frequency signal $f_r$. This is shown more clearly in FIG. 4 where the rising edge 106 of waveform 100 occurs before the rising 108 of waveform 92 (the reference frequency signal $f_r$).

The logical sequence of events which happens when $f_o$ occurs before $f_r$ is as follows. since the divide by N counter output pulse $Q_c$ ($f_o$) occurs before the rising edge of the reference frequency $f_r$ (edge 108 of waveform 92), counter 22 reaches its terminal count and the digital output on line 44 goes from a 0 to a 1. This causes the comparator latch circuit 30 to be set by virtue of a 0 (an inversion through gate 46) being applied on line 48. This in turn causes the output from comparator latch circuit 30 on line 68 to be a 1 and correspondingly the output from comparator latch 30 circuit on line 70 to be a 0. As mentioned previously, a gating pulse 94 (FIG. 4) is applied on line 78 from one-shot circuit 52 which enables simultaneously gates 72 and 74 such that the logic signals on lines 68 and 70 are applied by lines 82 and 80 respectively to the up and down terminals of up/down counter 32. In this situation, a 1 on line 68 goes through gate 72 and applies a 0 on the "up" terminal of up/down counter 32. The 0 on line 70 goes through gate 74 causing a 1 to be applied to line 80 and to the "down" terminal of up/down counter 32. In this case, the up/down counter 32 counts up one step meaning that the output on line 18a goes from a 0 to a 1. This is shown at point 110 on waveform 98. The 0 on the up line 82 is shown at 112 on the up waveform 114; the waveform 118 which occurs at the down terminal on line 80 to up/down counter 32 is illustrated at 116 at a one level. When synchronization of the circuit is obtained in FIG. 3, the output from the divided down output frequency $f_o$ appearing on line 44 will alternate between a 0 and 1. This will have the effect of causing up/down counter 32 to count up one step (that is, one least significant bit change) in one cycle and then down one step during the next cycle. This will, in turn, cause the frequency output from oscillator 36 appearing on line 20 to increase in frequency, $f_{LSB}$, and then decrease the same amount alternately for each cycle of the reference frequency $f_r$; this frequency $f_{LSB}$ is an amount equivalent to a change in the least significant bit of up/down counter 32. Waveform 104 of FIG. 4 illustrates this minor change in frequency when synchronization occurs.

Additional circuitry may be added to FIG. 3 to eliminate the $\pm f_{LSB}$ variation in the output frequency $f_o$ without departing from the scope of the invention described herein. This can be accomplished, by way of example, by adding additional logic to up/down counter 32 which would prevent U/D counter 32 from changing states unless it received two consecutive up or down commands; if counter 32 received an up command and then a down command, the output of counter 32 on lines 18a-18m would remain unchanged.

The series of gates included in one-shot circuit 52 provides a gating pulse in the following manner. The gating pulse 94 (FIG. 4) appearing on line 78 from one shot 52 always occurs on the rising edge 90 of waveform 92 (the reference frequency $f_r$). The reference frequency $f_r$ is initially at a 0 level on line 16b. Because of the odd number of inversions (3) caused by gates 56a-56c in the other leg of one-shot circuit 52, line 58 has a 1 on it. When the reference frequency $f_r$ changes from a 0 to a 1, line 16b immediately changes to a 1. However, line 58 delays its change from a 1 to a 0 because of the propagation delays caused by the three inverter gates 56a-56c. Therefore, the output of gate 54 momentarily is a function of the inputs of lines 16b and 58, both of which have 1's on them; the output of gate 54 goes low on line 60. The output on line 78, after going through inverter 76, therefore goes high as shown at 120 on waveform 94. A predetermined time period later, (in this case, about 30 nanoseconds), after the reference frequency signal $f_r$ is propagated through inverter gates 56a-56c, line 56 goes to 0, forcing the output 60 of gate 54 to return to a 1. After going through inverter gate 76, the 1 on line 60 is inverted to a 0 on line 78 as shown at point 122 on waveform 94. Therefore, a short positive-going pulse on line 78 occurs whenever the reference signal $f_r$ goes from a 0 to a 1. In contrast, when reference frequency $f_r$ goes from a 1 to a 0, there is no output from the one-shot circuit 52 because line 58 has 0 on it due to the inversion through inverters 56a–56c and line 16b goes from a 1 to 0. Therefore gate 54 has a 0 on one of its two inputs at all times which maintains the output of gate 54 on line 60 always 1 which in turn causes the output of gate 76 on line 78 to remain at 0 as shown at point 124 on waveform 94 in FIG. 4.

It should be pointed out that the circuit of FIG. 3 as well as the other embodiments of the invention disclosed herein have a basic advantage over prior art frequency or phase locked loops in that if the reference frequency $f_r$ is lost temporarily or indefinitely, the output frequency signal $f_o$ will remain at a value equal to the last digital value input by lines 18a–18m to the digital-to-analog converter 34.

Figure 5:
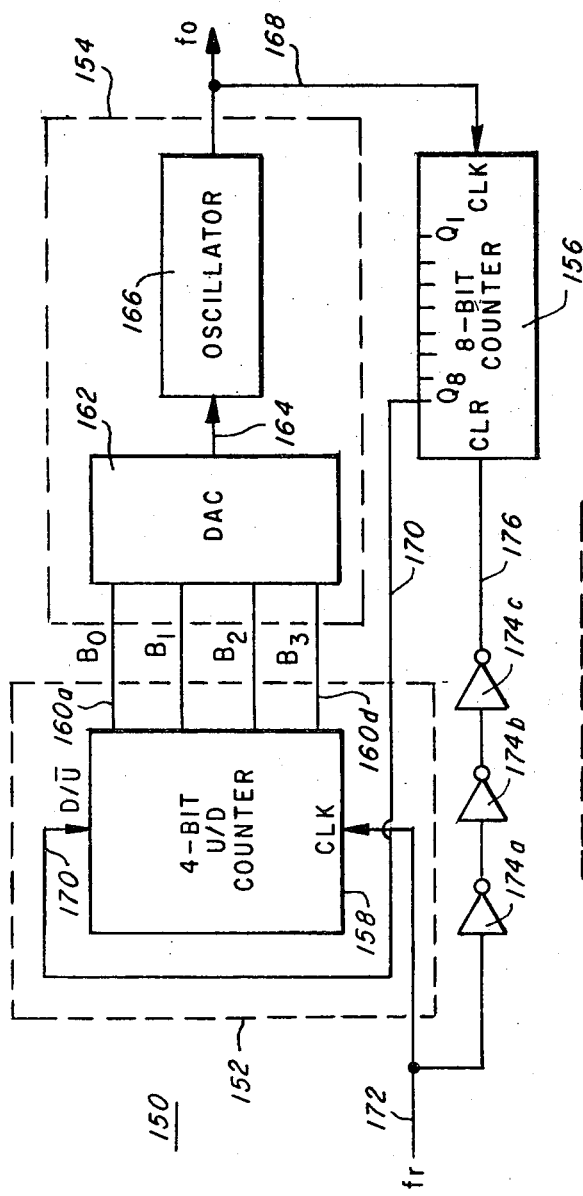
FIG. 5 is a block diagram of the preferred embodiment of the present invention.
Figure 6A:
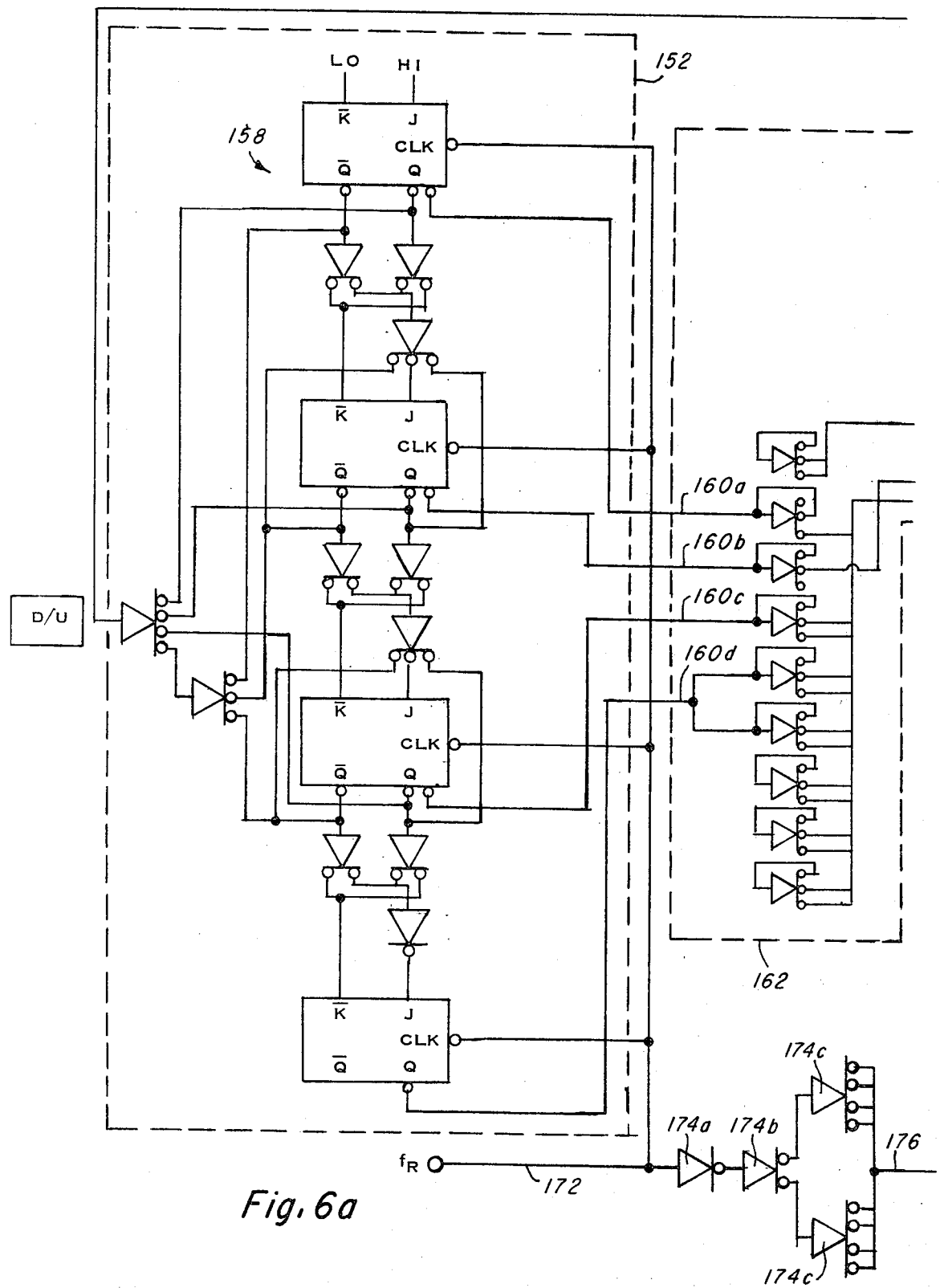
FIGS. 6a and 6b are schematics of an I²L integrated circuit chip version of the block diagram of FIG. 5.
Figure 6B:
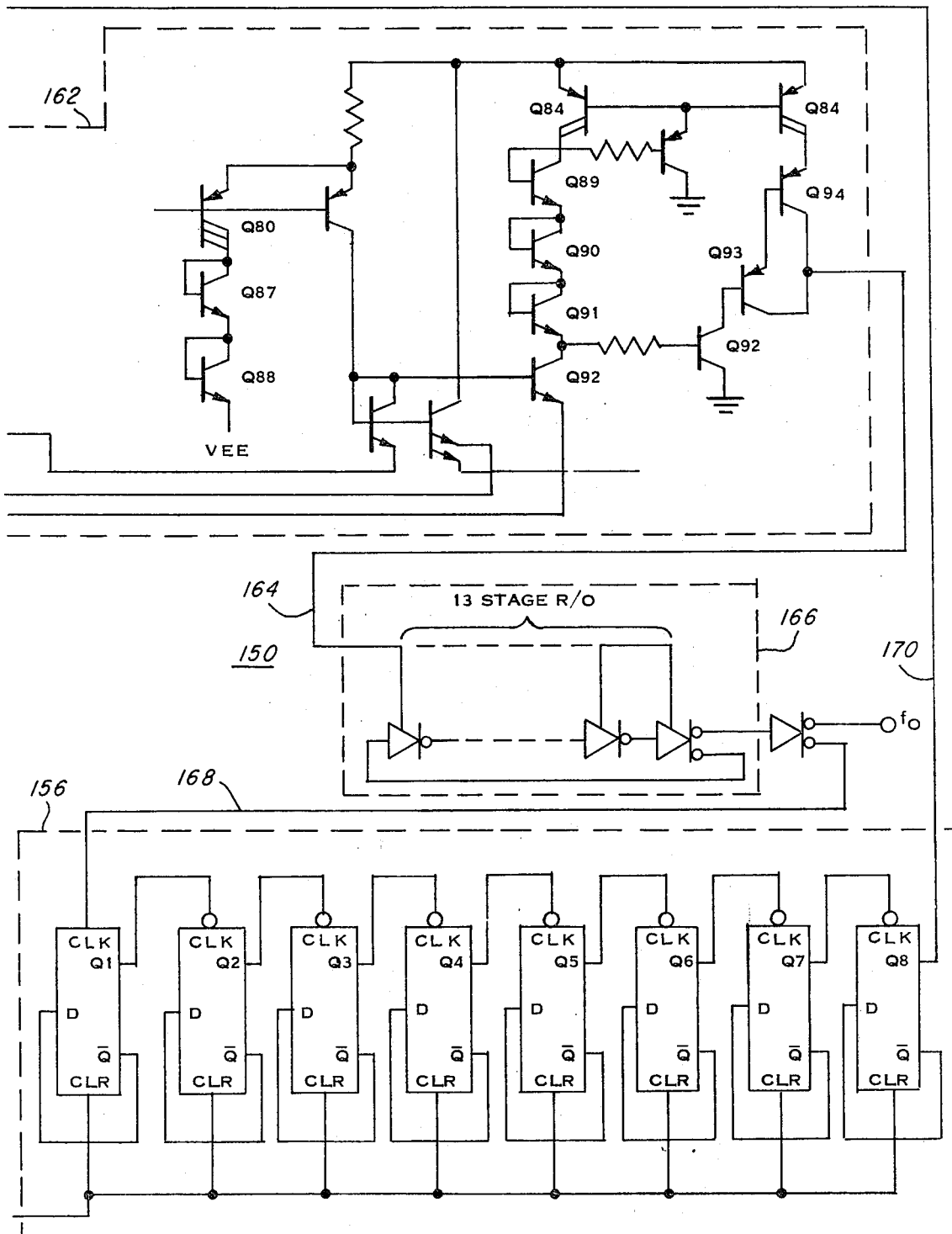

FIG. 5 illustrates a block diagram of another embodiment of the present invention; this embodiment lends itself to integration of the complete circuit on a single integrated circuit chip and FIG. 6 illustrates I²L schematic representation of the block diagram of FIG. 5 for incorporation on a single integrated circuit chip. The frequency or phase lock loop circuit 150 is comprised of a comparator circuit 152, digitally controlled oscillator circuit 154 and divide by N counter 156. In contrast to the circuit illustrated in FIG. 2 where the compare or latch circuit 30 and up/down counter 32 individually perform the comparator function 12, in the embodiment illustrated in FIG. 5 this dual function is performed by up/down counter 158. A digital output from up/down counter 158 is transmitted via lines 160a–160d to digital-to-analog converter 162. The output of digital-to-analog converter 162 is transmitted via line 164 to oscillator 166. The output of oscillator 166 is transmitted via line 168 to the clock input of an eight bit counter 156. The most significant bit output ($Q_8$) from counter 156 is transmitted via line 170 to the D/$\overline{U}$ terminal of counter 158. The reference frequency $f_r$ is transmitted via line 172 through three inverting gates 174a–174c via line 176 to the clear terminal of counter 156. This can be seen more clearly from FIG. 6 wherein line 176 is attached to the clear terminals of each of the eight stages of eight bit counter 156; also it can be seen that line 168 is connected to the clock terminal of stage 1 and thereafter the Q1 output of the first stage is connected to the clock input terminal of the second stage with this connection pattern carried throughout the eight stages of counter 156. Oscillator 166 as shown in FIG. 6 is connected up as an odd number of inverter stages (namely 13).

Except for the operation of compare circuit 152, the frequency and/or phase locked loop circuit 150 operates in a manner similar to that described with respect to circuit 10 illustrated in FIGS. 2–4.

Four bit up/down counter 158 combines the up clock and down clock in a single line 170, now labeled D/$\overline{U}$. A high level or 1 on line 170 will cause up/down counter 158 to count down one count. A low level or 0 on line 170 will cause counter 158 to count up one count. The compare function in circuit 30 (in FIG. 3) determined whether the rising edge 90 of waveform 92 ($f_r$) occurred before the rising edge of the output of $Q_c$ (waveform 100 in FIG. 4). The same type of comparison is implemented with up/down counter 158. The counter is required to determine whether the output Q8 on line 170 from counter 156 (which is a divided down representation of $f_o$) occurs before or after the reference frequency signal $f_r$ on line 172. This is accomplished as follows. If output Q8 occurs before the rising edge of the reference frequency $f_r$, then line 170 will be high or a logic 1 will be transmitted to the D/$\overline{U}$ terminal of counter 158 indicating that the counter should count down one step. It the reference frequency $f_r$ on line 172 occurs first, i.e., before Q8 from counter 156 has had a chance to go high or become a logic 1, then line 170 will transmit a low level or 0 to the D/$\overline{U}$ terminal indicating the up/down counter 158 should count up one count. The up/down counter 158 will continue either to count down or up dependent upon the relationship of $f_r$ and $f_o$ such that the counter 158 and digital-to-analog converter 162 will adjust the oscillator frequency of oscillator 166 in such a direction as to minimize the difference error between the two signals. The three inverting gates 174a–174c shown in series with reference frequency signal $f_r$ and connected to the clear terminal of eight bit counter 156 are necessary to delay the clearing of counter 156 until after the up/down counter 152 has had a chance to clock.

Figure 7:
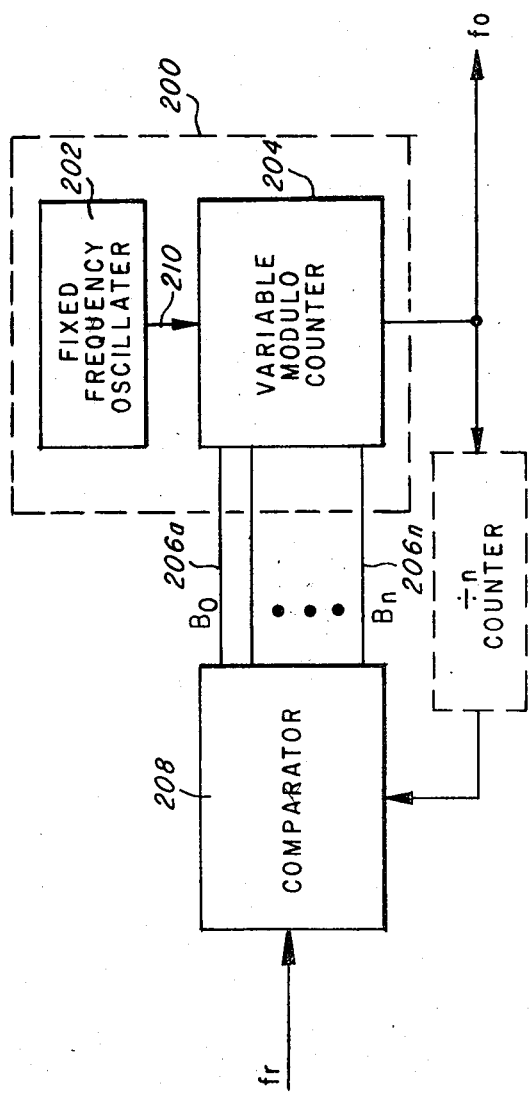
FIG. 7 is a still further embodiment of the frequency and/or phase locked loop circuit according to the present invention.

FIG. 7 illustrates an alternate embodiment of a digitally controlled oscillator 200. This digitally controlled oscillator 200 may be used in any of the other circuit embodiments of the invention illustrated in FIGS. 1–3 and 5–6. Digitally controlled oscillator 200 is comprised of a fixed frequency oscillator 202 connected to a variable modulo counter 204. Counter 204 may be comprised of standard TTL counters designated as SN 74193 manufactured and sold by Texas Instruments Incorporated while fixed frequency oscillator 202 may be a TTL precision timer model No. SN 75255 manufactured and sold by Texas Instruments Incorporated, Dallas, Tex. The digital signals on lines 206a–206n correspond in function to lines 160a–160d in FIG. 5. In other words, lines 206a–206n have digital signals thereon which will either increase or decrease the output frequency $f_o$ dependent upon the comparison made in comparator circuit 208. The digital word on lines 206a–206n is loaded into counter 204 and such discrete digital word generates a specific modulus or divisor which divides down the fixed frequency oscillator output. After each comparison in comparator 208, a new digital word is formed on lines 206a–206n and then loaded into counter 204 which generates another divisor which produces a new divided down output frequency. This implementation is completely digital and has the advantage of enhanced stability and noise immunity.

Although the present invention has been shown and illustrated in terms of a specific apparatus, it will be apparent that changes or modifications can be made without departing from the spirit and scope of the invention as defined by the appended claims.

What is claimed is:

1. A circuit for synchronizing the frequency and/or phase of an output signal to a reference frequency signal comprising:
a digitally controlled oscillator for producing said output signal which can be varied dependent upon a digital signal which can be varied and applied to the input of the oscillator,
comparator means coupled to said output signal from said oscillator and to said reference frequency signal for determining which of said signals occurs first and generating at least one said digital signal to be applied to the input of the oscillator indicating whether the frequency of said output signal should be increased or decreased, the comparator means including a compare means, up/down counter means whose input is coupled to the compare means and whose output is coupled to said oscillator, an additional counter means whose input is coupled to said output signal and whose output is coupled to said compare means for dividing down the frequency of said output signal, and means responsive to the occurrence of a rising edge in said reference frequency signal waveform for clearing the additional counter and resetting the up/down counter means.

2. A circuit for synchronizing frequency and/or phase of an output signal to a reference frequency signal comprising:

comparator means coupled to said reference signal and a signal representative of said output signal to determine which of said signals occurs first and generating digital signals increasing or decreasing in steps indicating whether said representative signal should be increased or decreased, the comparator means including compare means and up/down counter means whose input is coupled to said compare means and which provides said digital signals as its output, digital-to-analog converter means coupled to said digital signals from the comparator means for generating increasing or decreasing analog controlled voltage steps related to the increasing or decreasing digital signal steps, a variable frequency controlled oscillator coupled to said converter means for providing the output signal and for adjusting the frequency of the output signal upward or downward in order to obtain synchronization between said reference frequency signal and said output frequency signal, an additional counter whose input is coupled to said output signal and whose output is coupled to said comparator means for dividing down the frequency of said output signal to produce said signal representative of said output signal, and means responsive to the occurrence of a rising edge of a reference frequency signal waveform for clearing the additional counter, and resetting the up/down counter means and compare means of the comparator means.

3. A circuit according to claim 2 wherein said digital signals increase or decrease in discrete digital steps and said increasing or decreasing analog control voltage changes by an amount related to the least significant bit of said digital-to-analog converter.

4. A circuit for synchronizing the frequency and/or phase of an output signal to a reference frequency signal comprising:

a digitally controlled oscillator for producing said output signal which can be varied dependent upon input digital signals which can be varied and applied to the input of the oscillator, up/down counter means coupled to a signal representative of said output signal from said oscillator and to said reference frequency signal for determining which of said signals occurs first and generating one or more of said digital signals increasing or decreasing in steps indicating whether the frequency of said output signal should be increased or decreased, an additional counter means whose input is coupled to said output signal and whose output is coupled to said up/down counter means for dividing down the frequency of said output signal and applying the divided down signal as said signal representative of said output signal to the up/down counter means, and means responsive to the occurrence of a rising edge of a reference frequency signal waveform for clearing the additional counter and resetting the up/down counter means.

5. A circuit according to claim 4 wherein said up/down counter means include a compare circuit for determining which of said reference or output frequency signals occur first.

6. A circuit according to claim 4 wherein said digitally controlled oscillator comprises:

digital-to-analog converter means coupled to said digital signals for generating increasing or decreasing analog control voltage steps related to the increasing or decreasing digital signal steps, and a variable frequency control oscillator coupled to said converter for adjusting the output frequency signal upward or downward in order to obtain synchronization between said reference frequency signal and said output frequency signal.

7. A circuit according to claim 6 wherein said digital signals increase or decrease in discrete digital steps and said increasing or decreasing analog control voltage changes by an amount related to the least significant bit of said converter.

8. A circuit according to claim 7 wherein when synchronization is obtained the frequency of the output frequency signal is related to the reference frequency signal by $f_r \pm f_{LSB}$, where $f_r$ is the reference signal and $f_{LSB}$ is the frequency change in said oscillator produced by a one bit change in the least significant bit of said digital-to-analog converter.

9. A circuit for synchronizing the frequency and/or phase of an output signal to a reference frequency signal comprising:

comparator means coupled to said reference frequency signal and a signal representative of said output signal to determine which of said signals occurs first and generating digital signals indicating whether said representative signal should be increased or decreased, the comparator means including up/down counter means, a fixed frequency oscillator generating a fixed frequency signal greater than the reference frequency signal, a variable modulo counter having as inputs said digital signals and said fixed frequency signal such that discrete changes in said digital signals cause discrete modulus changes in said counter to thereby produce said output signal having a variable frequency which changes in discrete steps, and which is to be synchronized with said reference frequency signal, an additional counter means whose input is coupled to said output signal and whose output is coupled to said up/down counter means for dividing down the frequency of said output signal and applying the divided down signal as said signal representative of said output signal to the input of the up/down counter means, and means responsive to the occurrence of a rising edge of a reference frequency signal waveform for clearing the additional counter and resetting the up/down counter means.

* * * * *